US012763121B2

(12) United States Patent
Park et al.

(10) Patent No.: US 12,763,121 B2
(45) Date of Patent: Oct. 13, 2026

(54) SEMICONDUCTOR DEVICE INCLUDING MEMORY CELLS SHARING BIT LINES IN WRITE OPERATION

(71) Applicant: KOREA UNIVERSITY RESEARCH AND BUSINESS FOUNDATION, Seoul (KR)

(72) Inventors: Jongsun Park, Seoul (KR); TaeHwan Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 113 days.

(21) Appl. No.: 18/423,980

(22) Filed: Jan. 26, 2024

(65) Prior Publication Data

US 2024/0257852 A1 Aug. 1, 2024

(30) Foreign Application Priority Data

Jan. 31, 2023 (KR) ........................ 10-2023-0012810
Jun. 22, 2023 (KR) ........................ 10-2023-0080152

(51) Int. Cl.
*G11C 11/16* (2006.01)

(52) U.S. Cl.
CPC ...... *G11C 11/1659* (2013.01); *G11C 11/1673* (2013.01); *G11C 11/1675* (2013.01)

(58) Field of Classification Search
CPC ............ G11C 11/1659; G11C 11/1673; G11C 11/1675
USPC .......................................................... 365/158
See application file for complete search history.

(56) References Cited

U.S. PATENT DOCUMENTS

| | | | | |
|---|---|---|---|---|
| 9,715,916 | B1 * | 7/2017 | Tomishima | G11C 11/1657 |
| 2016/0035415 | A1 * | 2/2016 | Pelley | G11C 13/0028 365/72 |
| 2022/0051709 | A1 * | 2/2022 | Jaiswal | G11C 5/025 |
| 2022/0148635 | A1 | 5/2022 | Yogendra et al. | |
| 2022/0310146 | A1 * | 9/2022 | Xing | G11C 11/1675 |
| 2023/0189662 | A1 * | 6/2023 | Yoshikawa | H10N 52/00 257/421 |
| 2023/0280978 | A1 * | 9/2023 | Xing | G11C 11/1659 708/190 |

(Continued)

OTHER PUBLICATIONS

Tetsuo Endoh et al., "A Recent Progress of Spintronics Devices for Integrated Circuit Applications", Journal of Low Power Electronics and Applications, Nov. 13, 2018, 17 pages.

(Continued)

*Primary Examiner* — Sung Il Cho
(74) *Attorney, Agent, or Firm* — Hauptman Ham, LLP

(57) ABSTRACT

The semiconductor device includes a first memory cell, a second memory cell disposed adjacent to the first memory cell along a first direction, a first bit line extending in a second direction perpendicular to the first direction and connected to the first memory cell, a second bit line and a third bit line extending in the second direction between the first memory cell and the second memory cell and connected to the first memory cell and the second memory cell, and a control unit connected to the first bit line, the second bit line, and the third bit line. The control unit performs a read operation on the first memory cell by using the first bit line and performs a write operation on the first memory cell or the second memory cell by using the second bit line and the third bit line.

10 Claims, 13 Drawing Sheets

(56) References Cited

U.S. PATENT DOCUMENTS

| | | | | |
|---|---|---|---|---|
| 2024/0005976 | A1* | 1/2024 | Fan | G11C 7/1006 |
| 2024/0079039 | A1* | 3/2024 | Yoshikawa | G11C 11/18 |
| 2024/0206347 | A1* | 6/2024 | Shakh | H10B 61/00 |

OTHER PUBLICATIONS

Korean Office Action issued on Aug. 19, 2024, in connection with the Korean Patent Application No. 10-2023-0080152, with its English translation, 9 pages.

* cited by examiner

SEMICONDUCTOR DEVICE INCLUDING MEMORY CELLS SHARING BIT LINES IN WRITE OPERATION

CROSS-REFERENCE TO RELATED APPLICATIONS

This application claims priority under 35 U.S.C. § 119 to Korean Patent Application No. 10-2023-0012810 filed on Jan. 31, 2023, and No. 10-2023-0080152 filed on Jun. 22, 2023, in the Korean Intellectual Property Office, the disclosures of which are incorporated by reference herein in their entireties.

BACKGROUND

Embodiments of the present disclosure described herein relate to a semiconductor device, and more particularly, relate to a semiconductor device including a memory cell array composed of a plurality of memory cells.

A high-speed and/or low-power electronic device requires a semiconductor memory element which operates in high speed and with a low operating voltage. To this end, a magnetic memory element has been proposed as the semiconductor memory element. The magnetic memory element is attracting attention as a next-generation semiconductor memory element because the magnetic memory element supports a high-speed operation and has a nonvolatile characteristic.

In particular, nowadays, interest in an SOT-MRAM (Spin Orbit Torque Magnetic Random Access Memory) which is a type of MRAM (Magnetic Random Access Memory) is increasing. In detail, the SOT-MRAM may express resistance magnitudes of a magnetic tunneling junction (MTJ) as data '1' and data '0'.

The SOT-MRAM may be implemented in the smaller area compared to a conventional CMOS-based memory. However, like the SOT-MRAM, the magnetic memory element which stores data in the form of a resistance may require a greater operating energy than a CMOS-based memory.

SUMMARY

Embodiments of the present disclosure provide a semiconductor device capable of operating with a low power without an increase in the area by allowing adjacent memory cells to share a bit line used in a write operation.

According to an embodiment, a semiconductor device which includes a plurality of memory cells may include a first memory cell, a second memory cell disposed adjacent to the first memory cell along a first direction, a first bit line extending in a second direction perpendicular to the first direction and connected to the first memory cell, a second bit line and a third bit line extending in the second direction between the first memory cell and the second memory cell and connected to the first memory cell and the second memory cell, and a control unit connected to the first bit line, the second bit line, and the third bit line. The control unit may perform a read operation on the first memory cell by using the first bit line and may perform a write operation on the first memory cell or the second memory cell by using the second bit line and the third bit line.

According to an embodiment, the first memory cell may further include a first spin orbit torque (SOT) element, a first transistor connected between a first end of the first SOT element and the first bit line, and a second transistor connected between a second end of the first SOT element and the second bit line or the third bit line. The control unit may perform the read operation on the first memory cell by applying a specified read current to the first transistor and the first SOT element through the first bit line.

According to an embodiment, the control unit may perform the write operation on the first memory cell by applying a first voltage to the second transistor and the first SOT element through the second bit line and applying a second voltage having a preset voltage difference with the first voltage through the third bit line.

According to an embodiment, the semiconductor device may further include a fourth bit line extending in the second direction and connected to the second memory cell. The second memory cell may include a second SOT element, a third transistor connected between a first end of the second SOT element and the fourth bit line, and a fourth transistor connected between a second end of the second SOT element and the second bit line and the third bit line. The control unit may perform the read operation on the second memory cell by applying the read current to the third transistor and the second SOT element through the fourth bit line.

According to an embodiment, the control unit may perform the write operation on the second memory cell by applying the first voltage to the fourth transistor and the second SOT element through the second bit line and applying the second voltage through the third bit line.

According to an embodiment, the semiconductor device may further include a first word line extending in the first direction and connected to the first memory cell. The control unit may apply a word line voltage to the first word line to activate the first transistor and the second transistor of the first memory cell and may perform the read operation or the write operation on the first memory cell in response to that the first transistor and the second transistor are activated.

According to an embodiment, the control unit may include a read circuit that generates the read current and applies the read current to the first memory cell or the second memory cell, a write circuit which generates the first voltage and the second voltage and applies the first voltage and the second voltage to the first memory cell or the second memory cell, and a monitoring circuit that senses a voltage of the first SOT element changed by the read current applied to the first SOT element.

According to an embodiment, the control unit may apply a sensing current to the first SOT element through the first bit line during the write operation on the first memory cell and may end the write operation performed by using the second bit line and the third bit line when a voltage of the first SOT element changed by the sensing current satisfies a preset criterion.

According to an embodiment, a control method of a semiconductor device may include applying a word line voltage to a first word line to activate a first memory cell, applying a specified read current to the first memory cell through a first bit line connected to the first memory cell, to perform a read operation on the first memory cell, and applying a first voltage to the first memory cell through a second bit line and applying a second voltage having a preset voltage difference with the first voltage through a third bit line, to perform a write operation on the first memory cell, and the second bit line and the third bit line may be electrically connected to the first memory cell and a second memory cell adjacent to the first memory cell.

According to an embodiment, the control method may further include applying a sensing current to the first memory cell through the first bit line during the write operation on the first memory cell, and ending the write operation, based on whether a voltage change according to the sensing current applied through the first bit line satisfies a preset criterion.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
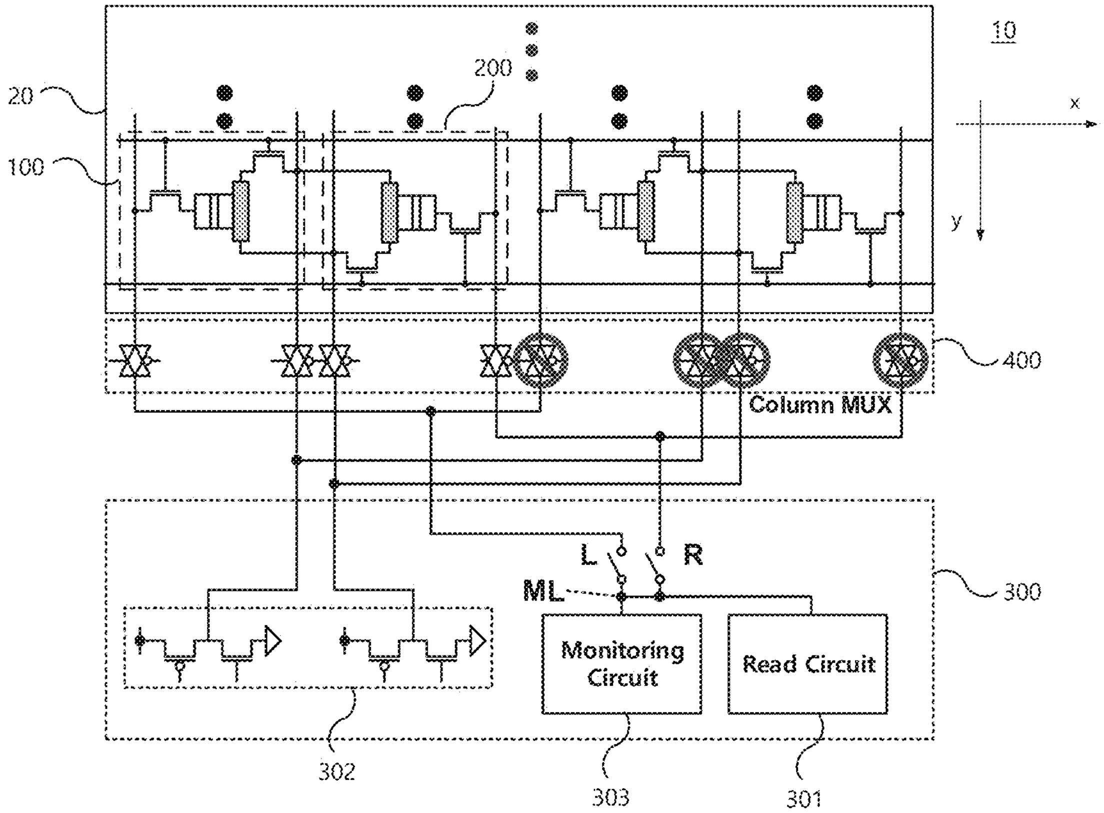
FIG. 1 is a circuit diagram of a semiconductor device according to an embodiment of the present disclosure.

Below, the present disclosure will be described with reference to the accompanying drawings. Because the present disclosure is variously changed and has multiple embodiments, specific embodiments thereof are shown by way of an example in the drawings, and detailed descriptions thereof will be given. It should be understood, however, that there is no intent to limit the present disclosure to specific embodiments, but on the contrary, the present disclosure is to cover all modifications, equivalents, and alternatives falling within the spirit and scope of the invention. With regard to the description of the drawings, similar components may be marked by similar reference numerals/signs.

The expressions "include" and "comprise" or "may include" and "may comprise" used in the present disclosure indicate the existence of relevant features, operations, or elements disclosed herein but do not exclude additional one or more functions, operations, or elements. It will be further understood that the terms "comprise", "have", and/or "include" when used in various embodiments of the present disclosure, specify the presence of stated features, numbers, steps, operations, elements, components, or a combination thereof but do not preclude the presence or addition of one or more other features, numbers, steps, operations, elements, components, and/or combinations thereof.

In the present disclosure, the expression "or" includes any combination of words listed together or all combinations thereof. For example, the expression "A or B" may include "A", may include "B", or may include both "A" and "B".

In the present disclosure, the expressions "first", "second", and the like may modify various components of the present disclosure but do not limit the components. For example, the expressions do not limit the order of the components and/or priorities of the components. The expressions may be used to distinguish one component from another component. For example, "a first user device" and "a second user device" may indicate all user devices and may indicate different user devices. For example, without departing from the scope and spirit of the present disclosure, a first component may be referred to as a "second component", and similarly, the second component may be referred to as the "first component".

It should be understood that when a first component is referred to as being "connected" or "coupled" to a second component, it can be directly connected or coupled to the second component or intervening components may be present. In contrast, it should be understood that when a first component is referred to as being "directly connected" or "directly coupled" to a second component, there are no intervening components.

The terms used herein are used only to describe a specific embodiment and are not intended to limit the present disclosure. The articles "a", "an", and "the" are singular in that they have a single referent, but the use of the singular form should not preclude the presence of more than one referent.

Unless otherwise defined, all terms including technical and scientific terms used herein have the same meaning as commonly understood by those of ordinary skill in the art to which the present disclosure pertains. It should be understood that terms as defined in commonly used dictionaries should be interpreted as having a meaning that is consistent with their meaning in the context of the relevant art and will not be interpreted in an idealized or overly formal sense unless expressly so defined herein.

FIG. 1 is a circuit diagram of a semiconductor device according to an embodiment of the present disclosure.

Referring to FIG. 1, a semiconductor device 10 according to an embodiment may include a memory cell array 20 including a plurality of memory cells and a control unit 300 connected to the memory cell array 20.

In addition, the semiconductor device 10 may further include a selection circuit 400 which is connected to the memory cell array 20 and the control unit 300 and selects at least some of the plurality of memory cells. In this case, the selection circuit 400 may be referred to as a "MUX circuit" having a plurality of input/output terminals.

In detail, the semiconductor device 10 may include the memory cell array 20 which includes the plurality of memory cells arranged in a matrix of dimension N×M.

The memory cell array 20 may include a plurality of word lines extending in a first direction (e.g., an x-direction) and a plurality of bit lines extending in a second direction (e.g., a y-direction). Also, the memory cell array 20 may include the plurality of memory cells each electrically connected to at least some of the plurality of word lines and the plurality of bit lines.

In this case, each of the plurality of memory cells may include a plurality of transistors operating for the read operation or the write operation and a spin orbit torque (SOT) element connected to the plurality of transistors.

The memory cell array 20 may include a first memory cell 100 and a second memory cell 200, and the second memory cell 200 may be disposed adjacent to the first memory cell 100 along the first direction (e.g., the x-direction). Also, the memory cell array 20 may include a plurality of bit lines extending in the second direction between the first memory cell 100 and the second memory cell 200.

In this case, the plurality of bit lines formed between the first memory cell 100 and the second memory cell 200 may be electrically connected to the first memory cell 100 and the second memory cell 200.

According to an embodiment, the control unit 300 may include a read circuit 301, a write circuit 302, and a monitoring circuit 303.

In detail, the control unit 300 may include the read circuit 301, which outputs a preset current, to perform the read operation on a specific memory cell.

Also, the control unit 300 may include the write circuit 302, which outputs a first voltage and a second voltage having a preset voltage difference, to perform the write operation on a specific memory cell.

In addition, the control unit 300 may further include the monitoring circuit 303 which monitors a voltage change according to an input current applied during the write operation on the specific memory cell.

In this case, the control unit 300 may execute software (or a program) to control at least one component (e.g., a hardware or software component) connected to the control unit 300 and may perform various data processing or calculations (or operations). The control unit 300 may include a central processing unit, a microprocessor, etc. and may control an overall operation of the semiconductor device 10. Accordingly, below, the operation that is performed by the semiconductor device 10 may be understood as being performed under control of the control unit 300.

The control unit 300 may apply the preset current to at least some of the plurality of memory cells by using the read circuit 301. In detail, the control unit 300 may apply a current output from the read circuit 301 to at least some specific memory cells among the plurality of memory cells through the selection circuit 400. For example, the control unit 300 may apply a specified current to the first memory cell 100 by using the read circuit 301.

In addition, the control unit 300 may sense a voltage change caused by the current applied to the specific memory cell. For example, the control unit 300 may sense a voltage change caused by the current applied to the first memory cell 100 by using the monitoring circuit 303.

As such, the control unit 300 may read data stored in advance in each memory cell. In detail, the control unit 300 may identify data "0" or data "1" stored in a relevant memory cell, based on a voltage change of a memory cell to which a current is applied.

Also, the control unit 300 may apply the first voltage and the second voltage, which have the preset voltage difference, to at least some of the plurality of memory cells by using the write circuit 302. In detail, the control unit 300 may apply the first voltage and the second voltage output from the write circuit 302 to at least some specific memory cells among the plurality of memory cells through the selection circuit 400.

For example, the control unit 300 may apply the first voltage and the second voltage output from the write circuit 302 to the second memory cell 200 through the bit lines disposed between the first memory cell 100 and the second memory cell 200.

As such, the control unit 300 may write data in each memory cell. In detail, the control unit 300 may write data "0" or data "1" in a specific memory cell by applying voltages with a preset voltage difference to the specific memory cell.

According to the above description, the control unit 300 may perform the write operation on one memory cell among two adjacent memory cells through the bit lines formed between the two adjacent memory cells. That is, the bit lines formed between the two adjacent memory cells may be formed to be connected in common to the two adjacent memory cells.

Accordingly, the semiconductor device 10 according to the present disclosure may minimize the area of the memory cell array 20. Also, the semiconductor device 10 may have the minimized area.

In addition, the control unit 300 may sense a voltage output from a specific memory cell by using the monitoring circuit 303. In detail, while performing the write operation on a specific memory cell, the control unit 300 may sense a voltage output from the specific memory cell by using monitoring circuit 303.

According to an embodiment, while applying a voltage to a specific memory cell by using the write circuit 302, the control unit 300 may apply a specified current to the specific memory cell by using the read circuit 301. In addition, the control unit 300 may sense a change of an output voltage caused by the current applied to the specific memory cell through the read circuit 301, by using the monitoring circuit 303.

For example, while applying the first voltage and the second voltage to the second memory cell 200 through a plurality of bit lines, the control unit 300 may apply a current to the second memory cell 200 through a bit line distinguished from the above bit lines. Also, the control unit 300 may sense a change in an output voltage of the second memory cell 200, which is caused by the current applied to the second memory cell 200, by using the monitoring circuit 303.

In addition, the control unit 300 may end the write operation on the memory described above, in response to that the sensed output voltage change satisfies a preset criterion.

As such, the control unit 300 may prevent the write operation from being continuously performed unnecessarily. Accordingly, the semiconductor device 10 according to the present disclosure may minimize power consumption in the write operation.

Figure 2A:
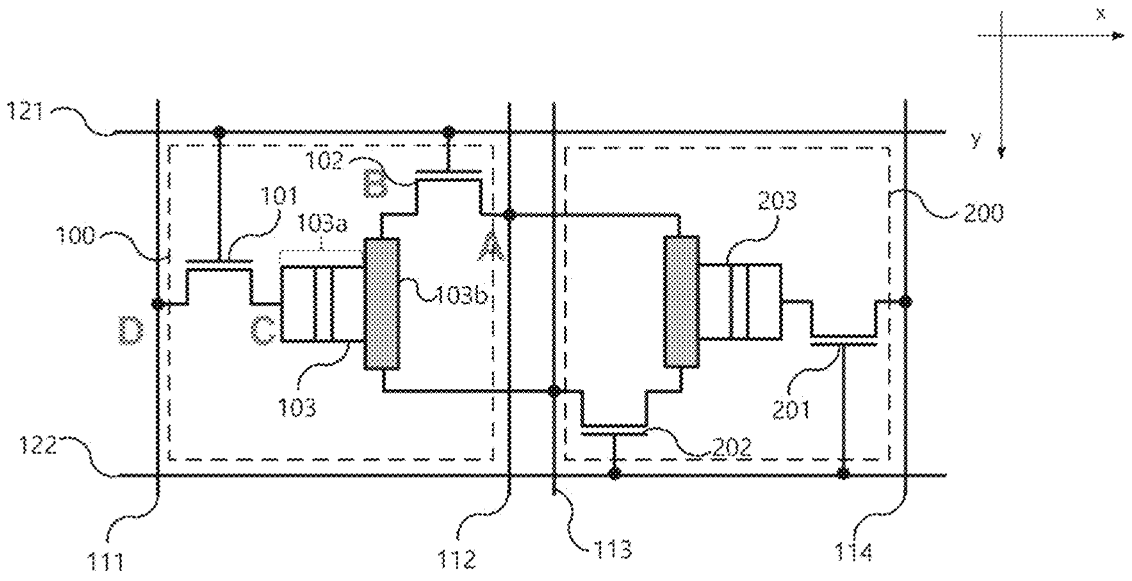
FIG. 2A is a circuit diagram illustrating a first memory cell and a second memory cell of FIG. 1.
Figure 2B:
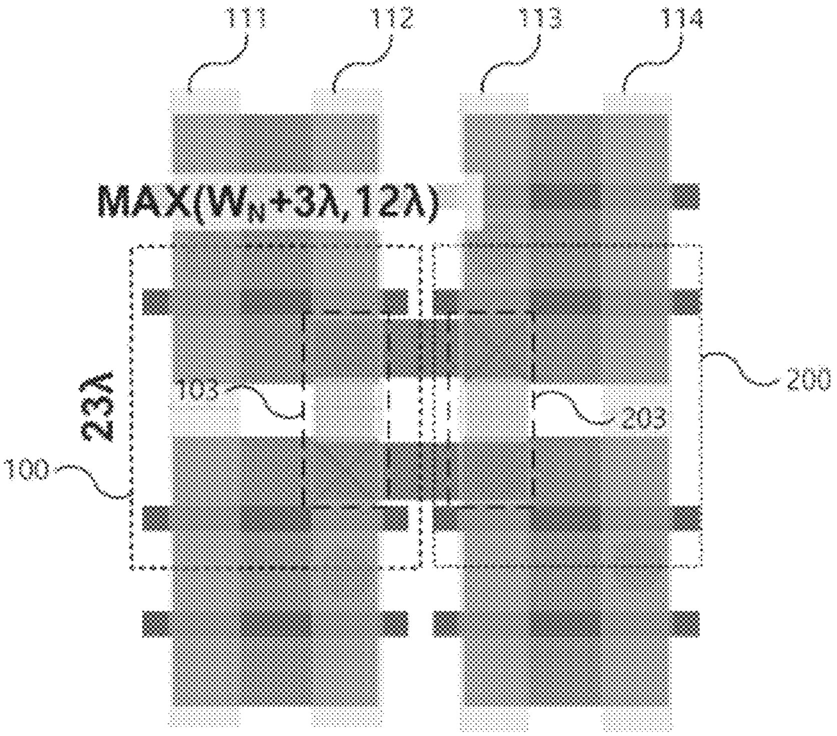
FIG. 2B illustrates a layout of a first memory cell and a second memory cell of FIG. 2A.

FIG. 2A is a circuit diagram illustrating a first memory cell and a second memory cell of FIG. 1. FIG. 2B illustrates a layout of a first memory cell and a second memory cell of FIG. 2A.

Referring to FIGS. 2A and 2B together, according to an embodiment, the first memory cell 100 and the second memory cell 200 connected to a plurality of word lines 121 and 122 and a plurality of bit lines 111, 112, 113, and 114 may be disposed adjacent to each other.

In detail, the first memory cell 100 and the second memory cell 200 may be connected to the word lines 121 and 122 extending in the first direction (e.g., the x-direction) and the plurality of bit lines 111, 112, 113, and 114 extending in the second direction (e.g., the y-direction) perpendicular to the first direction. Also, the first memory cell 100 and the second memory cell 200 may be disposed adjacent to each other along the first direction.

according to an embodiment, the first bit line 111 may extend in the second direction (e.g., the y-direction) perpendicular to the first direction and may be connected to the first memory cell 100. Also, the fourth bit line 114 may extend in the second direction and may be connected to the second memory cell 200.

In addition, the second bit line 112 and the third bit line 113 may be formed between the first memory cell 100 and the second memory cell 200 and may extend in the second direction. In this case, the second bit line 112 and the third bit line 113 may be electrically connected to the first memory cell 100 and the second memory cell 200.

The first word line 121 may extend in the first direction and may be connected to the first memory cell 100. Also, the second word line 122 may extend in the first direction and may be connected to the second memory cell 200.

According to an embodiment, the first memory cell 100 may include a first transistor 101, a second transistor 102, and a first SOT element 103.

In detail, the first memory cell 100 may include the first transistor 101 connected between a first end of the first SOT element 103 and the first bit line 111. For example, the first memory cell 100 may include the first transistor 101 connected between a first end "C" of the first SOT element 103 and one point "D" of the first bit line 111.

Also, the first memory cell 100 may include the second transistor 102 connected between a second end of the first SOT element 103 and the second bit line 112 or the third bit line 113. For example, the first memory cell 100 may include the second transistor 102 connected between a second end "B" of the first SOT element 103 and one point "A" of the second bit line 112.

In this case, each of the first transistor 101 and the second transistor 102 may include a gate electrode connected to the first word line 121.

Also, the first memory cell 100 may include the first SOT element 103 disposed between the first transistor 101 and the second transistor 102. In this case, the first SOT element 103 may be connected to a source-drain electrode of the first transistor 101 and a source-drain electrode of the second transistor 102.

The first SOT element 103 may be understood as an element whose state changes depending on a current applied to the first SOT element 103. In detail, the first SOT element 103 may be understood as a resistive memory element whose resistance state changes depending on a current applied through the first transistor 101 and/or the second transistor 102.

According to an embodiment, the first SOT element 103 may include a magnetic tunnel junction (MTJ) pattern 103*a* and a metal layer 103*b*. In this case, one surface of the magnetic tunnel junction pattern 103*a* may be formed to contact the metal layer 103*b*.

For example, the magnetic tunnel junction pattern 103*a* may be connected to the source-drain electrode of the first transistor 101. Also, the metal layer 103*b* may be connected to the source-drain electrode of the second transistor 102 and the third bit line 113. However, the connection relationship between the magnetic tunnel junction pattern 103*a* and the metal layer 103*b* is not limited to the above example.

The magnetic tunnel junction pattern 103*a* may have a magnetization direction which is capable of being changed depending on a current applied to the metal layer 103*b*. The magnetic tunnel junction pattern 103*a* may have perpendicular magnetic anisotropy.

To this end, the magnetic tunnel junction pattern 103*a* may include a magnetic material. For example, the magnetic tunnel junction pattern 103*a* may include at least one of iron (Fe), cobalt (Co), nickel (Ni), boron (B), silicon (Si), platinum (Pt), palladium (Pd), and an alloy thereof.

The metal layer 103*b* may be configured to apply a spin-orbit torque to the magnetic tunnel junction pattern 103*a*.

In detail, the metal layer 103*b* may induce the switching of the magnetic tunnel junction pattern 103*a* by using the spin hall effect or the Rashba effect by the spin-orbit torque when a current flows through the metal layer 103*b*. To this end, the metal layer 103*b* may include, for example, a heavy metal or materials doped with a heavy metal.

Also, the second memory cell 200 may include a third transistor 201, a fourth transistor 202, and a second SOT element 203.

In detail, the second memory cell 200 may include the second SOT element 203, the third transistor 201 connected between a first end of the second SOT element 203 and the fourth bit line 114, and the fourth transistor 202 connected between a second end of the second SOT element 203 and the second bit line 112 and the third bit line 113. In this case, each of the third transistor 201 and the fourth transistor 202 may include a gate electrode connected to the second word line 122.

Also, the second SOT element 203 may be understood as having a configuration corresponding to that of the first SOT element 103 described above. Thus, additional description will be omitted to avoid redundancy.

According to the above configuration, the first memory cell 100 and the second memory cell 200 may respectively include the transistors 101 and 201 connected to different bit lines 111 and 114. Also, the first memory cell 100 and the second memory cell 200 may include the transistors 102 and 202 connected to the second bit line 112 and the third bit line 113.

Referring to the above configuration, the read operation and the write operation on the first memory cell 100 or the second memory cell 200 may be performed through transistors and electrical paths distinguished from each other.

As such, the semiconductor device 10 according to the present disclosure may prevent the degradation of performance caused when the electrical paths of the read operation and the write operation on a memory cell overlap each other.

Referring to FIG. 2B, the first memory cell 100 and the second memory cell 200 according to an embodiment may be electrically connected to the second bit line 112 and the third bit line 113, respectively.

In detail, the first memory cell 100 may include the first SOT element 103 which is electrically connected to the second bit line 112 and the third bit line 113. Also, the second memory cell 200 may include the second SOT element 203 which is electrically connected to the second bit line 112 and the third bit line 113.

The second bit line 112 and the third bit line 113 may be connected in common to the first memory cell 100 and the second memory cell 200. In addition, the write operation on each of the first memory cell 100 and the second memory cell 200 may be performed through the second bit line 112 and the third bit line 113.

According to the present disclosure, the semiconductor device 10 with the above configuration may be implemented such that adjacent memory cells share a bit line used in the write operation.

Accordingly, the semiconductor device 10 according to the present disclosure may minimize the area of the memory cell array 20. In addition, the semiconductor device 10 may have the minimized area.

Figure 3A:
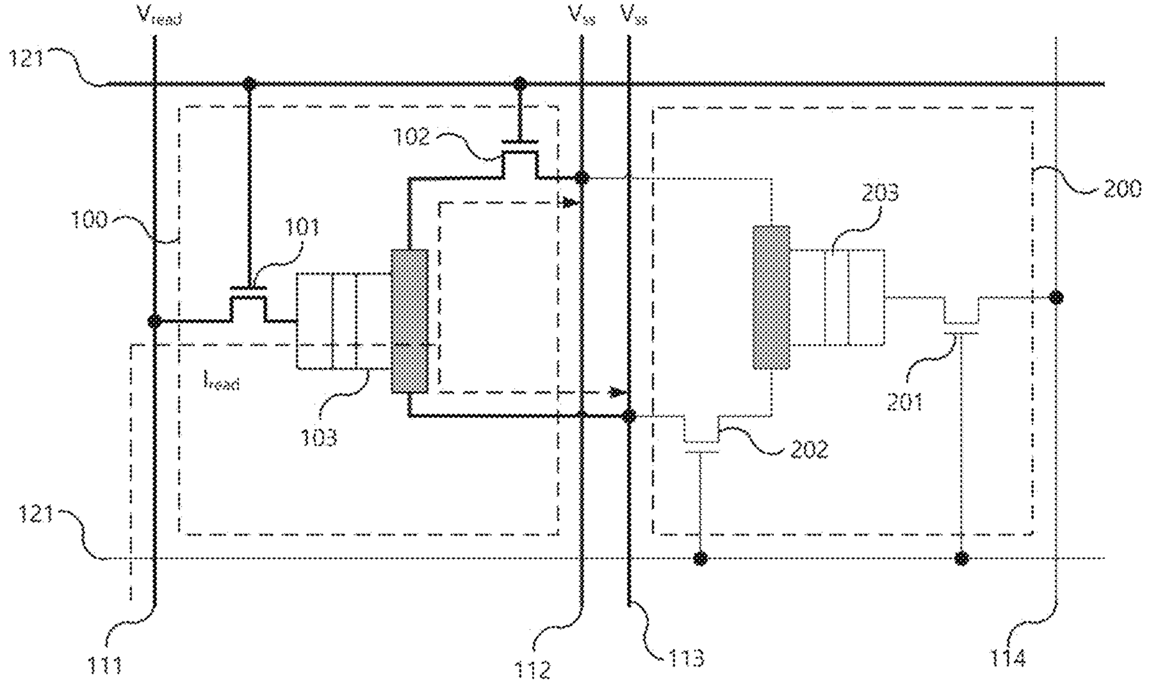
FIG. 3A illustrates a configuration of performing a read operation on a first memory cell of FIG. 2A.
Figure 3B:
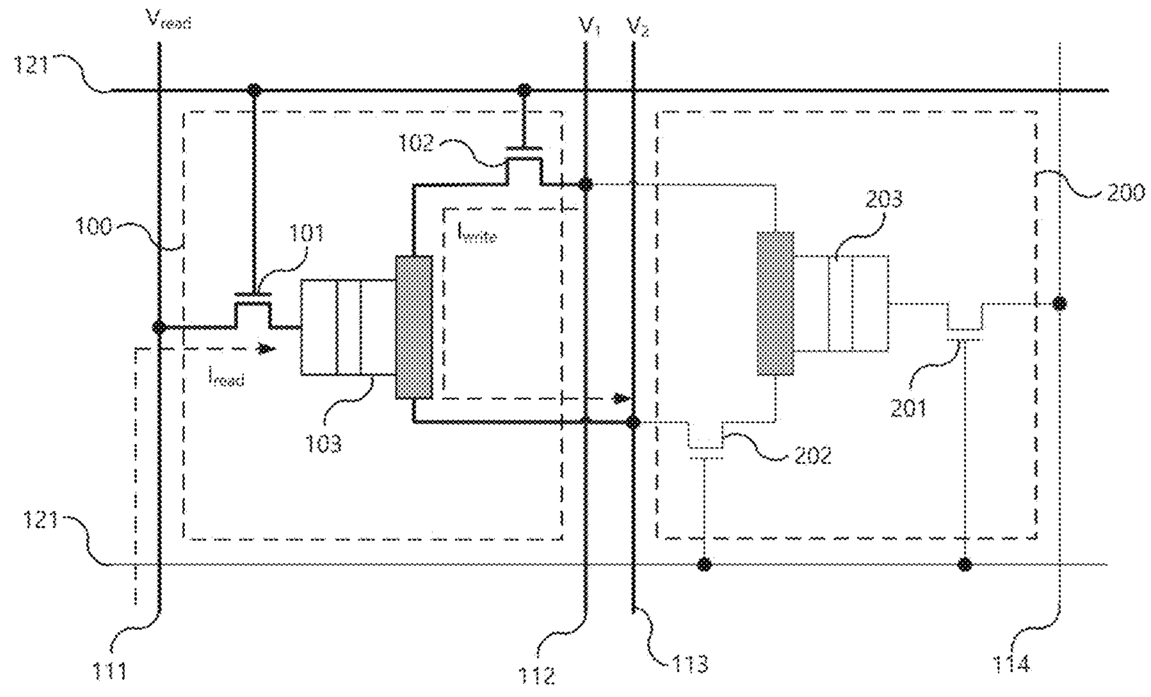
FIG. 3B illustrates a configuration of performing a write operation on a first memory cell of FIG. 2A.
Figure 3C:
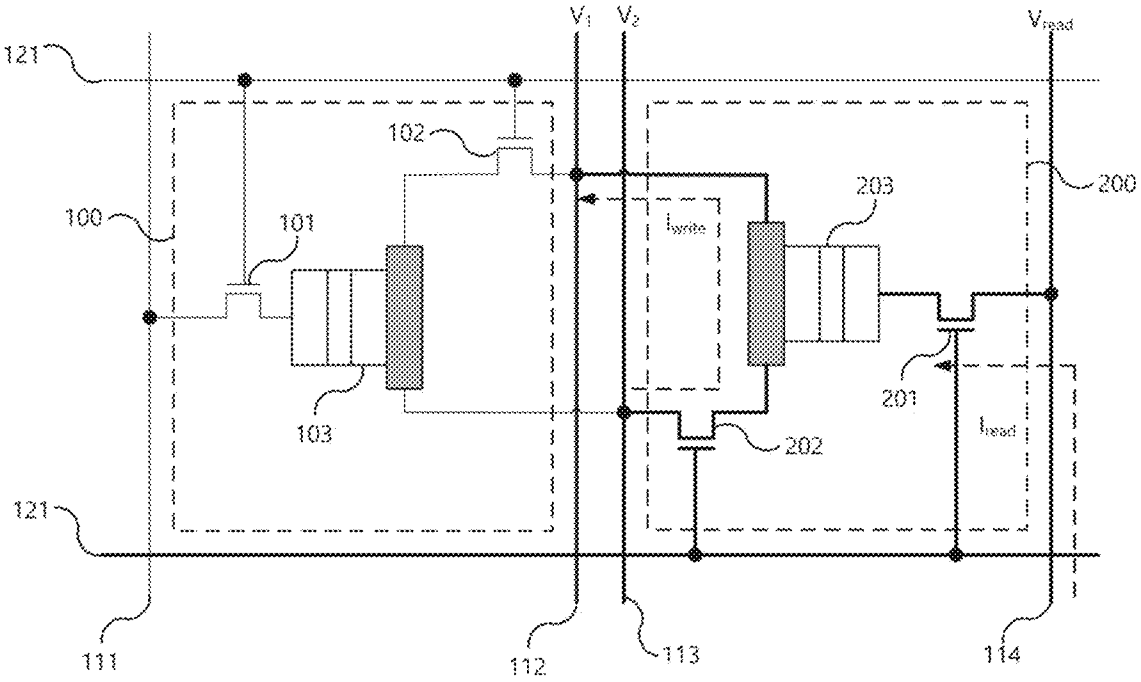
FIG. 3C illustrates a configuration of performing a write operation on a second memory cell of FIG. 2A.

FIG. 3A illustrates a configuration of performing a read operation on a first memory cell of FIG. 2A. FIG. 3B illustrates a configuration of performing a write operation on a first memory cell of FIG. 2A. FIG. 3C illustrates a configuration of performing a write operation on a second memory cell of FIG. 2A.

Referring to FIGS. 3A, 3B, and 3C together, the control unit 300 according to an embodiment may perform the read operation or the write operation on the first memory cell 100 or the second memory cell 200.

First, the control unit 300 may apply a word line voltage to the first word line 121 or the second word line 122. As such, the control unit 300 may activate one of the first memory cell 100 or the second memory cell 200.

For example, the control unit 300 may apply the word line voltage to the first word line 121 to activate the first transistor 101 and the second transistor 102 of the first memory cell 100 connected to the first word line 121. For another example, the control unit 300 may apply the word line voltage to the second word line 122 to activate the third transistor 201 and the fourth transistor 202 of the second memory cell 200 connected to the second word line 122.

Referring to FIG. 3A, the control unit 300 according to an embodiment may perform the read operation on the first bit line 111 through the first bit line 111.

In detail, the control unit 300 may perform the read operation on the first memory cell 100 by applying a read current $I_{read}$ to the first transistor 101 and the first SOT element 103 through the first bit line 111.

The control unit 300 may apply the read current $I_{read}$ to the first SOT element 103 through the first bit line 111 and the first transistor 101 by using the read circuit 301. In this case, the control unit 300 may apply a read voltage $V_{read}$ through the first bit line 111.

In addition, the control unit 300 may sense a voltage change through the second bit line 112 and the third bit line 113 in response to that the read current $I_{read}$ is applied to the first SOT element 103 through the first bit line 111.

The control unit 300 may identify the data stored in advance in the first SOT element 103, based on the voltage change sensed through the second bit line 112 and the third bit line 113.

Through the above components, the control unit 300 may perform the read operation on the first memory cell 100.

Also, according to another embodiment, the control unit 300 may apply the read current $I_{read}$ to the second memory cell 200 through the fourth bit line 114. In detail, the control unit 300 may apply the read current $I_{read}$ to the third transistor 201 and the second SOT element 203 through the fourth bit line 114.

In addition, the control unit 300 may sense a voltage of the second SOT element 203, which is changed by the read current $I_{read}$ applied to the second SOT element 203.

As such, the control unit 300 may perform the read operation on the second memory cell 200.

Referring to FIG. 3B, the control unit 300 according to an embodiment may perform the write operation on the first memory cell 100 by using the second bit line 112 and the third bit line 113.

In detail, the control unit 300 may perform the write operation on the first memory cell 100 by applying voltages with a specified voltage difference to the first memory cell 100 through the second bit line 112 and the third bit line 113.

The control unit 300 may apply the voltages with the specified voltage difference to the first SOT element 103 through the second bit line 112 and the third bit line 113 by using the write circuit 302. For example, the control unit 300 may apply a first voltage $V_1$ to the first SOT element 103 through the second bit line 112 and may apply a second voltage $V_2$ having a preset voltage difference with the first voltage $V_1$ to the first SOT element 103 through the third bit line 113.

In addition, the control unit 300 may apply a write current $I_{write}$ to the first SOT element 103 by applying the voltages with the specified voltage difference through the second bit line 112 and the third bit line 113.

In this case, for example, when the first voltage $V_1$ is greater than the second voltage $V_2$, the control unit 300 may apply the write current $I_{write}$ flowing from the second bit line 112 to the third bit line 113 through the second transistor 102 and the first SOT element 103.

As such, the control unit 300 may write specific data in the first SOT element 103.

Through the above components, the control unit 300 may perform the write operation on the first memory cell 100.

According to the above description, the control unit 300 may perform the read operation and the write operation on the first memory cell 100 through transistors and electrical paths distinguished from each other.

For example, the control unit 300 may perform the read operation on the first memory cell 100 by using the first bit line 111 and the first transistor 101. Also, the control unit 300 may perform the write operation on the first memory cell 100 by using the second bit line 112, the third bit line 113, and the second transistor 102.

As such, the semiconductor device 10 according to the present disclosure may prevent the degradation of a speed and power efficiency due to a parasitic capacitor in the case of performing the read operation and the write operation on a memory cell through the same electrical path. Accordingly, the semiconductor device 10 may increase the speed and the power efficiency of the read operation and/or the write operation on the memory cell.

Referring to FIG. 3C, the control unit 300 according to an embodiment may perform the write operation on the second memory cell 200 through the second bit line 112 and the third bit line 113.

In detail, the control unit 300 may perform the write operation on the second memory cell 200 by applying voltages with a specified voltage difference to the second memory cell 200 through the second bit line 112 and the third bit line 113.

In addition, the control unit 300 may apply the voltages with the specified voltage difference to the second SOT element 203 through the second bit line 112 and the third bit line 113. For example, the control unit 300 may apply the first voltage $V_1$ to the second SOT element 203 through the second bit line 112 and may apply the second voltage $V_2$ having a preset voltage difference with the first voltage $V_1$ to the second SOT element 203 through the third bit line 113.

The control unit 300 may apply the write current $I_{write}$ to the second SOT element 203 by applying the voltages with the specified voltage difference through the second bit line 112 and the third bit line 113.

In this case, for example, when the first voltage $V_1$ is greater than the second voltage $V_2$, the control unit 300 may apply the write current $I_{write}$ flowing from the second bit line 112 to the third bit line 113 through the second SOT element 203 and the fourth transistor 202.

As such, the control unit 300 may write specific data in the second SOT element 203.

Through the above components, the control unit 300 may perform the write operation on the second memory cell 200.

Referring to FIGS. 3B and 3C together, the control unit 300 may perform the write operation on the first memory cell 100 or the second memory cell 200 by using the second bit line 112 and the third bit line 113.

That is, the control unit 300 may perform the write operation on one of the first memory cell 100 or the second memory cell 200 by using the second bit line 112 and the third bit line 113 connected in common to the first memory cell 100 and the second memory cell 200.

Accordingly, the semiconductor device 10 according to the present disclosure may minimize the area of the memory cell array 20. In addition, the semiconductor device 10 may increase the efficiency of the read operation or the write operation on the memory cell without increasing the area of the memory cell array 20.

Also, while performing the write operation on the first memory cell 100, the control unit 300 may apply the read current $I_{read}$ to the first memory cell 100 through the first bit line 111 by using the read circuit 301.

In detail, the control unit 300 may apply the read current $I_{read}$ to the first SOT element 103 through the first bit line 111 while applying the voltages with the specified voltage difference through the second bit line 112 and the third bit line 113. In this case, the control unit 300 may apply the read voltage $V_{read}$ through the first bit line 111.

Also, during the write operation on the first memory cell 100, the control unit 300 may sense a voltage change of the first SOT element 103, which is based on the current applied to the first SOT element 103, by using the monitoring circuit 303.

The control unit 300 may stop the write operation on the first memory cell 100, in response to that the sensed voltage change satisfies a preset criterion. In detail, when the voltage change of the first SOT element 103 due to the current applied to the first SOT element 103 satisfies the preset criterion, the control unit 300 may stop the operation of applying voltages and a current through the second bit line 112 and the third bit line 113.

According to the above configuration, when it is determined that preset data are written in a memory cell (or an SOT element), the control unit 300 may stop the write operation on the memory cell.

Accordingly, the semiconductor device 10 according to the present disclosure may prevent power consumption due to the maintenance of the write operation on the memory cell.

Figure 4:
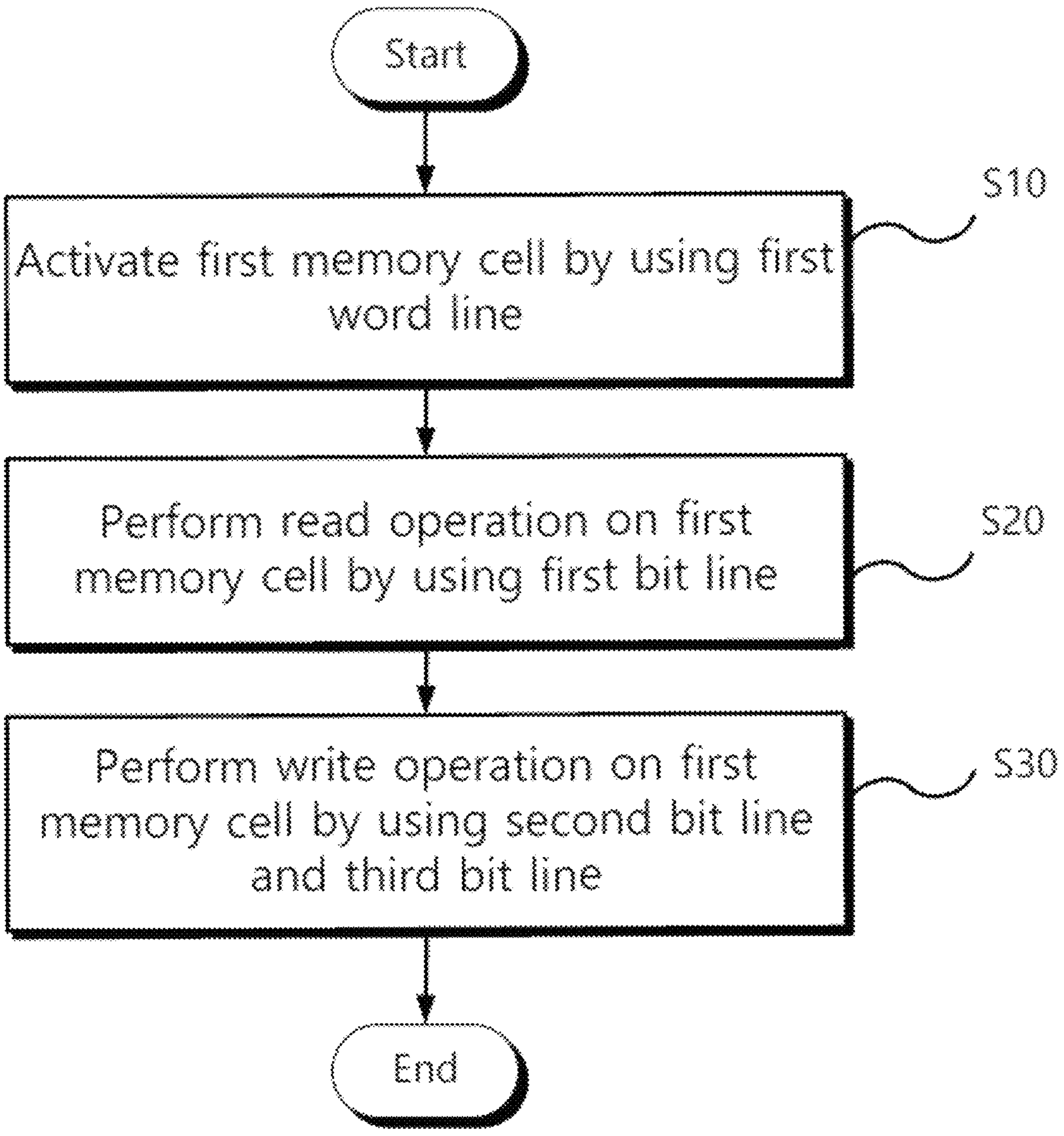
FIG. 4 is a flowchart illustrating an example in which a semiconductor device of FIG. 1 performs a read operation and a write operation on a first memory cell.

FIG. 4 is a flowchart illustrating an example in which a semiconductor device of FIG. 1 performs a read operation and a write operation on a first memory cell.

Referring to FIG. 4, the semiconductor device 10 (or the control unit 300) according to an embodiment may perform the read operation and the write operation on the first memory cell 100 through electrical paths distinguished from each other.

In operation S10, the control unit 300 may activate the first memory cell 100 by using the first word line 121.

In detail, the control unit 300 may apply the word line voltage through the first word line 121. As such, the control unit 300 may activate the first transistor 101 and the second transistor 102 of the first memory cell 100, which are connected to the first word line 121. For example, the control unit 300 may control the first transistor 101 and the second transistor 102 by applying the word line voltage to the gate electrode of each of the first transistor 101 and the second transistor 102 connected to the first word line 121.

In operation S20, the control unit 300 may perform the read operation on the first memory cell 100 by using the first bit line 111.

In detail, the control unit 300 may apply the read current $I_{read}$ to the first transistor 101 and the first SOT element 103 through the first bit line 111. In addition, the control unit 300 may sense a voltage change of the first SOT element 103 due to the read current $I_{read}$ applied to the first SOT element 103. That is, the control unit 300 may identify data stored in advance in the first SOT element 103.

In operation S30, the control unit 300 may perform the write operation on the first memory cell 100 by using the second bit line 112 and the third bit line 113.

In detail, the control unit 300 may apply voltages with a specified voltage difference to the first memory cell 100 through the second bit line 112 and the third bit line 113. Also, the control unit 300 may apply the write current $I_{write}$ to the second transistor 102 and the first SOT element 103 through the second bit line 112 and the third bit line 113. That is, the control unit 300 may perform the write operation on the first memory cell 100.

However, the order of operation S20 and operation S30 is not limited to the above example. According to another embodiment, the semiconductor device 10 may perform the write operation on the first memory cell 100 through operation S30 and may then perform the read operation on the first memory cell 100 through operation S20.

According to the above description, the control unit 300 may perform the read operation and the write operation on the first memory cell 100 through the electrical paths distinguished from each other.

As such, the semiconductor device 10 according to the present disclosure may prevent the degradation of a speed and power efficiency due to a parasitic capacitor in the case of performing the read operation and the write operation on a memory cell through the same electrical path.

Accordingly, the semiconductor device 10 may increase the speed and the energy efficiency of the read operation and/or the write operation on the memory cell.

Figure 5A:
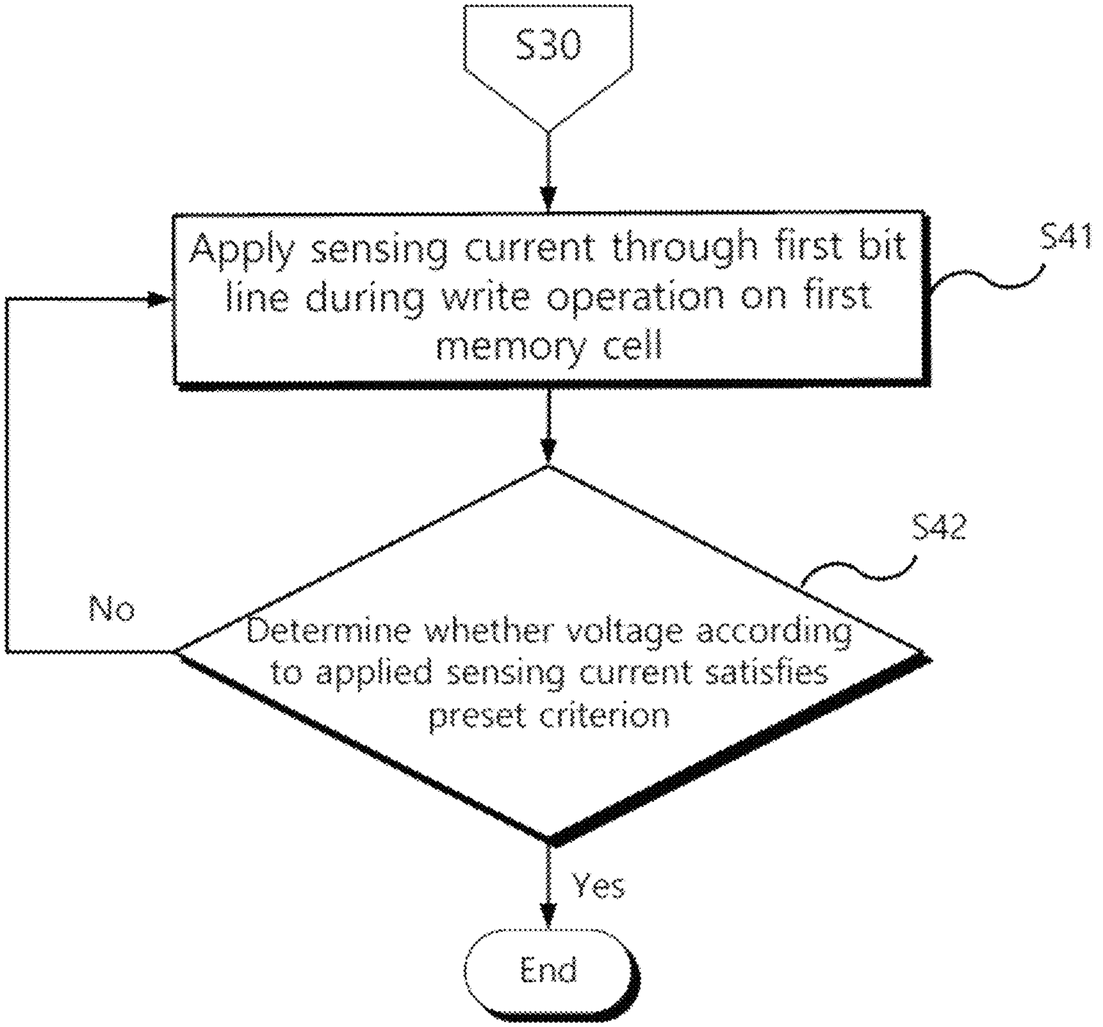
FIG. 5A is a flowchart illustrating an operation in which a semiconductor device of FIG. 1 ends a write operation by using a monitoring circuit.
Figure 5B:
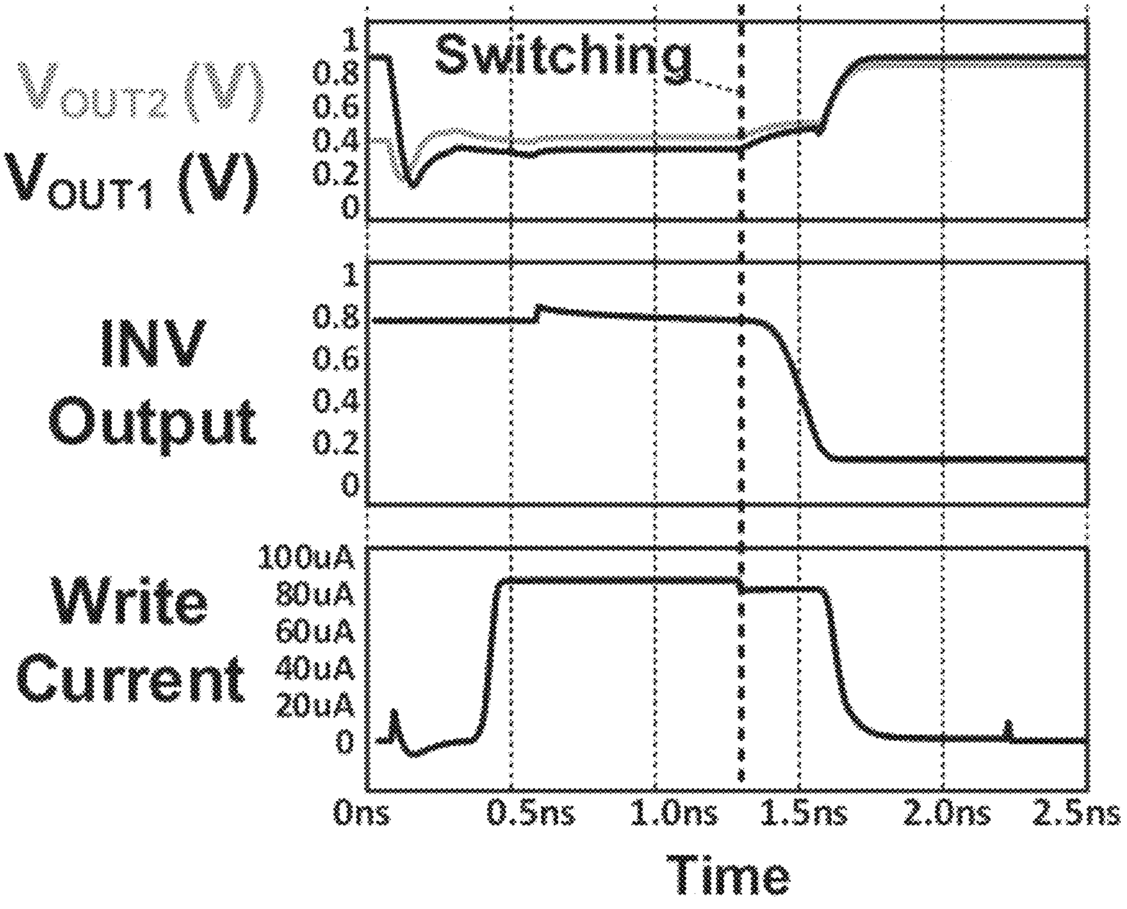
FIG. 5B illustrates a current applied to a first memory cell and a voltage output from the first memory cell during the operation of FIG. 5A in detail.

FIG. 5A is a flowchart illustrating an operation in which a semiconductor device of FIG. 1 ends a write operation by using a monitoring circuit. FIG. 5B illustrates a current applied to a first memory cell and a voltage output from the first memory cell during the operation of FIG. 5A in detail.

Referring to FIGS. FIGS. 5A and 5B together, the semiconductor device 10 (or the control unit 300) according to an embodiment may end the write operation based on a voltage change caused by a current applied during the write operation on a memory cell.

In operation S41, while performing the write operation on the first memory cell 100, the control unit 300 may apply a sensing current to the first memory cell 100 through the first bit line 111.

In detail, the control unit 300 may apply the sensing current to the first SOT element 103 through the first bit line 111 while applying the voltages with the specified voltage difference through the second bit line 112 and the third bit line 113. In this case, the sensing current applied to the first SOT element 103 may be referred to as a "current having the same value as the read current $I_{read}$", but the present disclosure is not limited thereto.

In operation S42, the control unit 300 may determine whether a voltage of the first SOT element 103 formed by the sensing current applied to the first memory cell 100 satisfies a preset criterion.

In detail, during the write operation on the first memory cell 100, the control unit 300 may sense the voltage of the first SOT element 103, which is based on the sensing current applied to the first SOT element 103.

In addition, the control unit 300 may stop the write operation on the first memory cell 100, in response to that the sensed voltage change satisfies the preset criterion.

In detail, when the voltage of the first SOT element 103 formed by the sensing current applied thereto satisfies the preset criterion, the control unit 300 may stop the operation of applying the write current $I_{write}$ through the second bit line 112 and the third bit line 113.

For example, referring to FIG. 5B, when a voltage INV Output of the first SOT element 103 corresponds to a preset switching voltage, the control unit 300 may apply the same voltage (e.g., $V_{ss}$) through the second bit line 112 and the third bit line 113.

For example, after the write current $I_{write}$ is applied through the second bit line 112 and the third bit line 113 and about 0.8 ns passes, when the voltage INV Output of the first SOT element 103 corresponds to the preset switching voltage, the control unit 300 may apply the same voltage, that is, about 0.9V, to the second bit line 112 and the third bit line 113.

According to the above configuration, when it is determined that preset data are written in a memory cell (or an SOT element), the control unit 300 may stop the write operation on the memory cell.

Accordingly, the semiconductor device 10 according to the present disclosure may prevent power consumption due to the maintenance of the write operation on the memory cell.

Figure 6A:
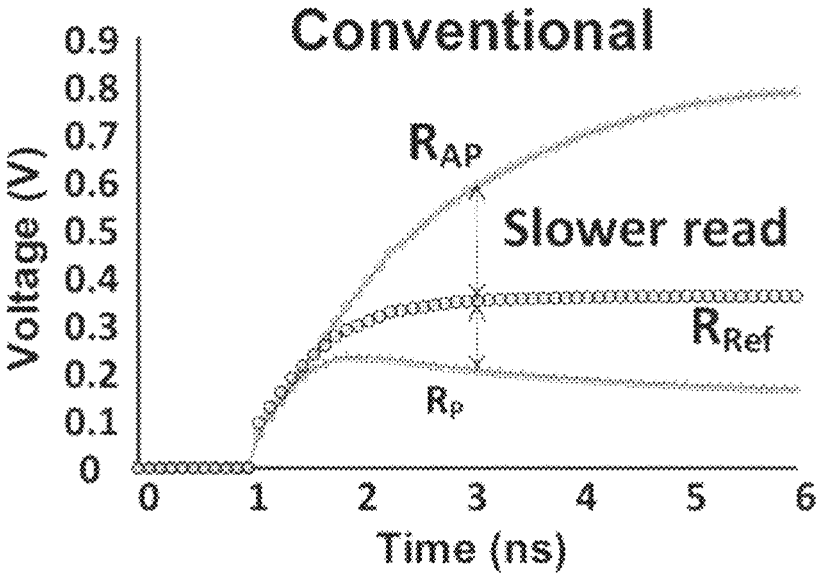
FIG. 6A illustrates a voltage change in a read operation which a conventional semiconductor device performs.
Figure 6B:
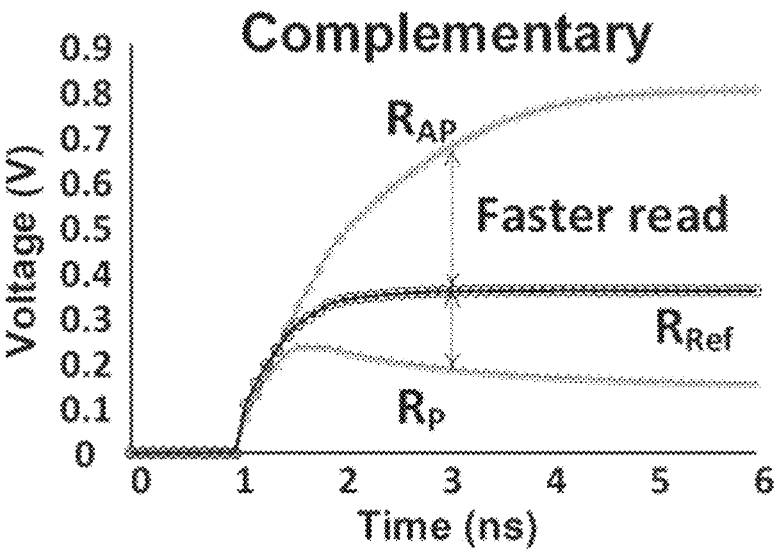
FIG. 6B illustrates a voltage change in a read operation which a semiconductor device according to an embodiment of the present disclosure performs.
Figure 7:
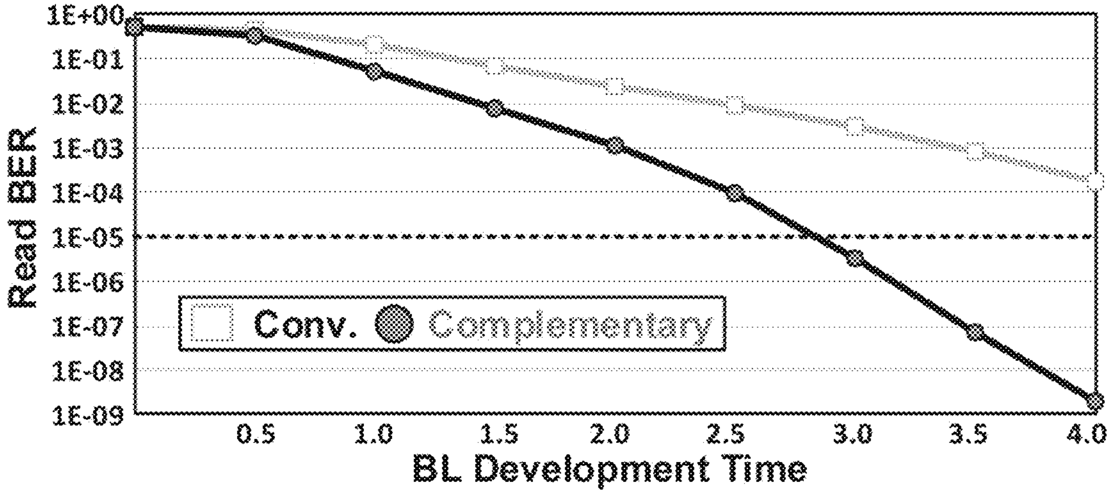
FIG. 7 illustrates an error rate caused when a semiconductor device according to an embodiment of the present disclosure performs a read operation and a write operation.

FIG. 6A illustrates a voltage change in a read operation which a conventional semiconductor device performs. FIG. 6B illustrates a voltage change in a read operation which a semiconductor device according to an embodiment of the present disclosure performs. FIG. 7 illustrates an error rate caused when a semiconductor device according to an embodiment of the present disclosure performs a read operation and a write operation.

Referring to FIGS. 6A, 6B, and 7 together, the semiconductor device 10 according to an embodiment may perform the read operation and the write operation on a memory cell by using electrical paths (or transistors) distinguished from each other. As such, the semiconductor device 10 may improve the speed of the read operation on the memory cell.

Referring to FIG. 6A, when a conventional semiconductor device performs the read operation and the write operation on the memory cell by using the same electrical path, after the read current $I_{read}$ is applied and about 3 ns passes, read voltages may change from a reference voltage $R_{Ref}$ as much as about 0.3 V or about 0.2 V.

For example, a first read voltage $R_{AP}$ according to the read current $I_{read}$ may change from the reference voltage $R_{Ref}$ as much as about 0.3 V after the read current $I_{read}$ is applied and about 3 ns passes. Also, a second read voltage $R_p$ according to the read current $I_{read}$ may change from the reference voltage $R_{Ref}$ as much as about 0.2 V after the read current $I_{read}$ is applied and about 3 ns passes.

Referring to FIG. 6B, when the semiconductor device 10 (or the control unit 300) according to the present disclosure performs the read operation and the write operation on the memory cell by using electrical paths distinguished from each other, after the read current $I_{read}$ is applied and about 3 ns passes, read voltages may change from the reference voltage $R_{Ref}$ as much as about 0.4 V or about 0.3 V.

For example, the first read voltage $R_{AP}$ according to the read current $I_{read}$ may change from the reference voltage $R_{Ref}$ as much as about 0.4 V after the read current $I_{read}$ is applied and about 3 ns passes. Also, the second read voltage $R_p$ according to the read current $I_{read}$ may change from the reference voltage $R_{Ref}$ as much as about 0.3 V after the read current $I_{read}$ is applied and about 3 ns passes.

In this case, the first read voltage $R_{AP}$ may be understood as a voltage sensed through the second bit line 112 after the read current $I_{read}$ passes through the first SOT element 103 and then passes through the second transistor 102. Also, the second read voltage $R_p$ may be understood as a voltage sensed through the third bit line 113 after the read current $I_{read}$ passes through the first SOT element 103.

In the case of FIG. 6A, for example, when the control unit 300 performs the read operation on the memory cell, the speed and the power efficiency of the read operation may decrease due to a parasitic capacitor of a transistor operating in the write operation.

In contrast, in the case of FIG. 6B, the control unit 300 may perform the read operation and the write operation on the first memory cell 100 through different transistors (e.g., 101 and 102). For example, the control unit 300 may perform the read operation on the first memory cell 100 through the first bit line 111 and the first transistor 101. Accordingly, the control unit 300 may prevent the decrease in the speed and the power efficiency of the read operation due to the parasitic capacitor of the second transistor 102 when performing the read operation.

Referring to FIG. 7, in the semiconductor device 10 according to the present disclosure, a bit error rate (BER) may decrease at a relatively fast speed compared to a semiconductor device including a conventional memory cell array.

In detail, in the read operation on the memory cell, the semiconductor device 10 according to the present disclosure may secure an error rate below a preset reference error rate within a relatively fast time compared to the conventional semiconductor device.

For example, the semiconductor device 10 according to the present disclosure may have an error rate below a reference error rate (e.g., about 1E-05) after the read operation is initiated and about 2.9 ns passes. In this case, the conventional semiconductor device may have an error rate of about 1E-01.

That is, the semiconductor device 10 according to the present disclosure may prevent the decrease in the speed of the read operation due to the parasitic capacitor.

Accordingly, in the read operation on the memory cell, the semiconductor device 10 according to the present disclosure may have a relatively high speed compared to the conventional semiconductor device.

Figure 8:
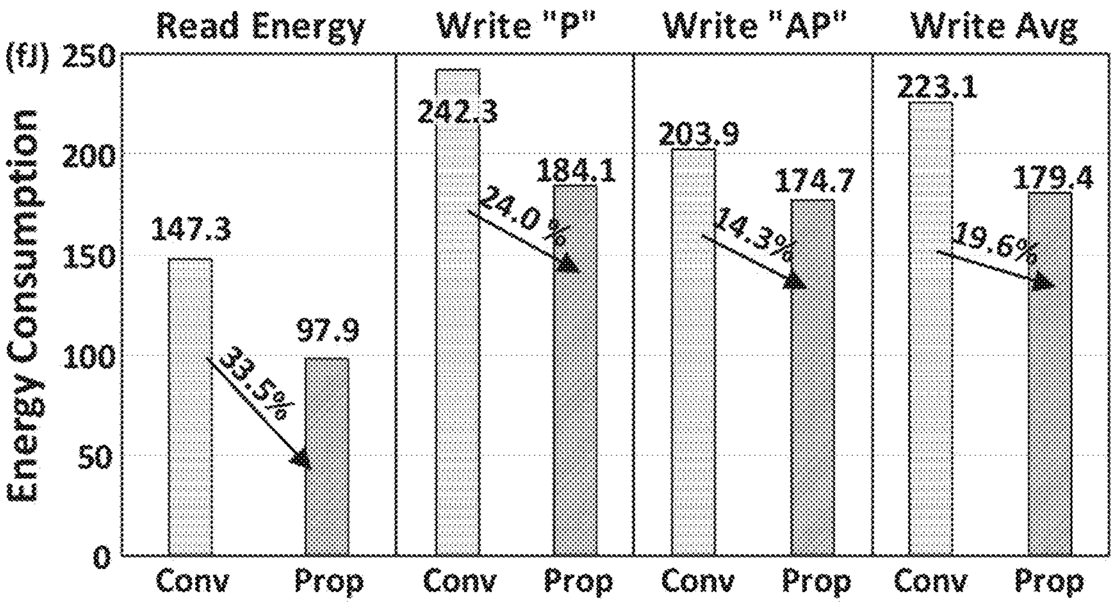
FIG. 8 illustrates power consumption caused when a semiconductor device according to an embodiment of the present disclosure performs a read operation and a write operation.

FIG. 8 illustrates power consumption caused when a semiconductor device according to an embodiment of the present disclosure performs a read operation and a write operation.

Referring to FIG. 8, the semiconductor device 10 (or the control unit 300) according to an embodiment may perform the read operation and the write operation on the memory cell by using low power consumption compared to the conventional semiconductor device.

According to an embodiment, the semiconductor device 10 may perform the read operation and the write operation on the memory cell by using electrical paths (or transistors) distinguished from each other. As such, the semiconductor device 10 may reduce power consumption in the read operation on the memory cell.

For example, the semiconductor device 10 may perform the read operation by using the first transistor 101 distinguished from the second transistor 102 which is used in the write operation on the memory cell. As such, the semiconductor device 10 may reduce power consumption from about 147.3 fJ (corresponding to the conventional case) to about 97.9 fJ in the read operation on the memory cell.

Also, the semiconductor device 10 may perform the write operation by using the second transistor 102 distinguished from the first transistor 101 which is used in the read operation on the memory cell.

For example, referring to FIGS. 3C and 8 together, the semiconductor device 10 may reduce power consumption from about 242.3 fJ (corresponding to the conventional case) to about 184.1 fJ in the write operation on the memory cell. In this case, the write current $I_{write}$ may be understood as flowing from the second bit line 112 to the third bit line 113 sequentially through the second SOT element 203 and the fourth transistor 202.

Also, referring to FIGS. 3B and 8 together, the semiconductor device 10 may reduce power consumption from about 203.9 fJ (corresponding to the conventional case) to about 174.7 fJ in the write operation on the memory cell. In this case, the write current $I_{write}$ may be understood as flowing from the second bit line 112 to the third bit line 113 sequentially through the second transistor 102 and the first SOT element 103.

As such, the semiconductor device 10 may reduce average power consumption from about 223.1 fJ (corresponding to the average conventional case) to about 179.4 fJ in the write operation on the memory cell.

That is, in the read operation and the write operation on the memory cell, the semiconductor device 10 according to the present disclosure may prevent power consumption from increasing due to a parasitic capacitor of a transistor connected to the same electrical path.

Accordingly, in the read operation and a write operation on the memory cell, the semiconductor device 10 according to the present disclosure may have a relatively high power efficiency compared to the conventional semiconductor device.

A semiconductor device of the present disclosure may include a plurality of memory cells sharing bit lines disposed adjacent to each other. As such, the semiconductor device may operate with a low power without increasing the area.

Also, the semiconductor device of the present disclosure may perform the write operation and the read operation on the memory cell through electrical paths separated from each other. Accordingly, the semiconductor device may reduce power consumption in the read operation and the write operation.

While the present disclosure has been described with reference to embodiments thereof, it will be apparent to those of ordinary skill in the art that various changes and modifications may be made thereto without departing from the spirit and scope of the present disclosure as set forth in the following claims.

This work was supported by the National Research Foundation of Korea (NRF) grate funded by the Korea government (MSIT) (No. NRF-2020M3F3A2A01082591 and No. NRF-2022M3H4A1A04096339).

What is claimed is:

1. A semiconductor device which includes a plurality of memory cells, the semiconductor device comprising:
- a first memory cell;
- a second memory cell disposed adjacent to the first memory cell along a first direction;
- a first bit line extending in a second direction perpendicular to the first direction and connected to the first memory cell;
- a second bit line and a third bit line extending in the second direction between the first memory cell and the second memory cell and connected to the first memory cell and the second memory cell;
- a first word line extending in the first direction and connected to the first memory cell;
- a second word line extending in the first direction and connected to the second memory cell; and
- a control unit connected to the first bit line, the second bit line, the third bit line, the first word line and the second word line,
- wherein the control unit is configured to:
  - perform a read operation on the first memory cell by using the first word line and the first bit line;
  - perform a write operation on the first memory cell by using the first word line, the second bit line and the third bit line; and
  - perform a write operation on the second memory cell by using the second word line, the second bit line and the third bit line.

2. The semiconductor device of claim 1, wherein the first memory cell further includes:
- a first spin orbit torque (SOT) element;
- a first transistor connected between a first end of the first SOT element and the first bit line; and
- a second transistor connected between a second end of the first SOT element and the second bit line or the third bit line,
- wherein the control unit performs the read operation on the first memory cell by applying a specified read current to the first transistor and the first SOT element through the first bit line.

3. The semiconductor device of claim 2, wherein the control unit performs the write operation on the first memory cell by applying a first voltage to the second transistor and the first SOT element through the second bit line and applying a second voltage having a preset voltage difference with the first voltage through the third bit line.

4. The semiconductor device of claim 3, further comprising:
- a fourth bit line extending in the second direction and connected to the second memory cell,
- wherein the second memory cell includes:
  - a second SOT element;
  - a third transistor connected between a first end of the second SOT element and the fourth bit line; and
  - a fourth transistor connected between a second end of the second SOT element and the second bit line and the third bit line, and
  - wherein the control unit performs the read operation on the second memory cell by applying the read current to the third transistor and the second SOT element through the fourth bit line.

5. The semiconductor device of claim 4, wherein the control unit performs the write operation on the second memory cell by applying the first voltage to the fourth transistor and the second SOT element through the second bit line and applying the second voltage through the third bit line.

6. The semiconductor device of claim 2, wherein the control unit is configured to:
- apply a word line voltage to the first word line to activate the first transistor and the second transistor of the first memory cell; and
- perform the read operation or the write operation on the first memory cell in response to that the first transistor and the second transistor are activated.

7. The semiconductor device of claim 3, wherein the control unit includes:

a read circuit configured to generate the read current and to apply the read current to the first memory cell or the second memory cell;

a write circuit configured to generate the first voltage and the second voltage and to apply the first voltage and the second voltage to the first memory cell or the second memory cell; and a monitoring circuit configured to sense a voltage of the first SOT element changed by the read current applied to the first SOT element.

8. The semiconductor device of claim 3, wherein the control unit is configured to:

apply a sensing current to the first SOT element through the first bit line during the write operation on the first memory cell; and when a voltage of the first SOT element changed by the sensing current satisfies a preset criterion, end the write operation performed by using the second bit line and the third bit line.

9. A control method of a semiconductor device, the control method comprising:

applying a word line voltage to a first word line to activate a first memory cell;

applying a specified read current to the first memory cell through a first bit line connected to the first memory cell, to perform a read operation on the first memory cell;

applying a first voltage to the first memory cell through a second bit line and applying a second voltage having a preset voltage difference with the first voltage through a third bit line, to perform a write operation on the first memory cell, wherein the second bit line and the third bit line are electrically connected to the first memory cell and a second memory cell adjacent to the first memory cell, and wherein the second memory cell is activated by applying the word line voltage to a second word line and a write operation on the second memory cell is performed by using the second word line, the second bit line and the third bit line.

10. The control method of claim 9, further comprising:

applying a sensing current to the first memory cell through the first bit line during the write operation on the first memory cell; and ending the write operation, based on whether a voltage change according to the sensing current applied through the first bit line satisfies a preset criterion.

* * * * *